(12) United States Patent
Barrett et al.

(10) Patent No.: US 12,079,036 B2
(45) Date of Patent: Sep. 3, 2024

(54) ELECTRONIC DEVICES WITH MOLDED DISPLAY MOUNTING STRUCTURES

(71) Applicant: Apple Inc., Cupertino, CA (US)

(72) Inventors: Daniel J. Barrett, Redwood City, CA (US); Dakota A. Bass, Foster City, CA (US); Sameer Pandya, Sunnyvale, CA (US); Shang L Tsuei, San Jose, CA (US); Elizabeth C. Porter, Sunnyvale, CA (US); Erik G. de Jong, San Francisco, CA (US); Jingjing Xu, Cupertino, CA (US); Jacquelynn M. Pok, San Jose, CA (US); Kiran S. Pillai, San Bruno, CA (US); Xuan Liu, Santa Clara, CA (US); Adam J. Brinkman, Sunnyvale, CA (US); Paul Choiniere, Livermore, CA (US); Daniel W. Jarvis, Sunnyvale, CA (US); Jia Liu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 34 days.

(21) Appl. No.: 17/340,893

(22) Filed: Jun. 7, 2021

(65) Prior Publication Data
US 2021/0405688 A1    Dec. 30, 2021

(51) Int. Cl.
G06F 1/16    (2006.01)
(52) U.S. Cl.
CPC ............ *G06F 1/1652* (2013.01); *G06F 1/163* (2013.01)
(58) Field of Classification Search
CPC ...... G06F 1/163; G06F 1/1652; G06F 1/1637; G06F 1/1601; G06F 1/1626; B32B 3/04; B32B 27/08; B32B 2457/20; Y02E 10/549; G09F 9/301; H01L 2251/5338; H01L 51/0097; G04G 17/045; G04G 17/08; G02F 1/133305; G02F 1/133308; H05K 5/0017
See application file for complete search history.

(56) References Cited

U.S. PATENT DOCUMENTS

| 9,195,108 | B2 | 11/2015 | Park et al. |
| 9,209,207 | B2 | 12/2015 | Park et al. |
| 9,244,300 | B2 | 1/2016 | Yu et al. |
| 9,516,743 | B2 | 12/2016 | Kim et al. |

(Continued)

FOREIGN PATENT DOCUMENTS

| CN | 105789252 A | 7/2016 |
| CN | 107910296 A | 4/2018 |

(Continued)

*Primary Examiner* — James Wu
(74) *Attorney, Agent, or Firm* — Treyz Law Group, P.C.; G. Victor Treyz; David K. Cole

(57) ABSTRACT

An electronic device may have a display mounted in a housing. The display may have a display panel with an array of pixels on a flexible substrate. A display cover layer may overlap the display panel. The flexible substrate may have a protruding portion that forms a tail. The tail may be coupled to a printed circuit on which a display driver integrated circuit and/or other circuitry is mounted. When the display is mounted in the housing, the tail may be bent back on itself to create a bend. The bend may be embedded in a molded polymer member. The molded polymer member may be attached to the housing with adhesive and may directly contact an inner surface of the display cover layer.

18 Claims, 17 Drawing Sheets

(56) References Cited

U.S. PATENT DOCUMENTS

| | | | |
|---|---|---|---|
| 9,568,800 B1 | 2/2017 | Sprague | |
| 9,933,875 B2 | 4/2018 | Martisauskas | |
| 10,133,428 B2 | 11/2018 | Kim et al. | |
| 10,134,540 B2 | 11/2018 | Choi et al. | |
| 10,631,437 B2* | 4/2020 | Fournier | H05K 7/20963 |
| 10,849,246 B2* | 11/2020 | Hooten | H05K 5/03 |
| 11,159,660 B2* | 10/2021 | Choi | H05K 5/0086 |
| 2013/0279088 A1 | 10/2013 | Raff et al. | |
| 2015/0373864 A1* | 12/2015 | Jung | H05K 1/028 |
| | | | 29/446 |
| 2015/0382446 A1 | 12/2015 | Kwon et al. | |
| 2016/0109852 A1* | 4/2016 | Kuwabara | G04G 17/08 |
| | | | 368/223 |
| 2016/0204366 A1 | 7/2016 | Zhang et al. | |
| 2018/0040838 A1 | 2/2018 | Zhai | |
| 2018/0081481 A1* | 3/2018 | Fournier | H05K 7/20963 |
| 2019/0212781 A1* | 7/2019 | Fujimoto | G06F 1/1643 |
| 2020/0196496 A1 | 6/2020 | Shin | |
| 2020/0205307 A1 | 6/2020 | Hooton et al. | |
| 2022/0309980 A1* | 9/2022 | Wang | H04M 1/22 |

FOREIGN PATENT DOCUMENTS

| | | |
|---|---|---|
| CN | 107978626 A | 5/2018 |
| CN | 108205970 A | 6/2018 |
| CN | 109462958 A | 3/2019 |
| CN | 110491295 A | 11/2019 |
| CN | 209821559 U | 12/2019 |
| EP | 3276469 A1 | 1/2018 |
| JP | 2006078622 A | 3/2006 |
| JP | 3207091 U | 10/2016 |
| KR | 20150099329 A | 8/2015 |
| KR | 20160022388 A | 2/2016 |
| KR | 20180118332 A | 10/2018 |
| KR | 20180121850 A | 11/2018 |
| KR | 20190018553 A | 2/2019 |
| KR | 102096221 B1 | 4/2020 |
| KR | 20210073592 A | 6/2021 |

* cited by examiner

ELECTRONIC DEVICES WITH MOLDED DISPLAY MOUNTING STRUCTURES

This application claims the benefit of provisional patent application No. 63/109,128, filed Nov. 3, 2020, and provisional patent application No. 63/044,306, filed Jun. 25, 2020, which are hereby incorporated by reference herein in their entireties.

FIELD

This relates generally to electronic devices, and, more particularly, to electronic devices with displays.

BACKGROUND

Electronic devices may have displays. Displays have arrays of pixels for displaying images for a user. To protect sensitive display structures from damage, displays may be provided with display cover layers. Flexible display substrates sometimes have tail portions that are bent back on themselves.

SUMMARY

An electronic device may have a display mounted in a housing. The device may be, for example a wristwatch having a wrist strap coupled to the housing.

The display may have a display panel with an array of pixels on a flexible substrate. A display cover layer may overlap the display panel. During operation, a user may view images on the display panel through the display cover layer.

The flexible substrate may have a laterally protruding portion that forms a tail. The tail may be coupled to a printed circuit on which a display driver integrated circuit and/or other circuitry is mounted. When the display is mounted in the housing, the tail may be bent back on itself to create a bend.

The electronic device may have a molded polymer member that is used in securing the display to the housing. The bend in the tail and/or other display structures may be embedded in the molded polymer member. The molded polymer member may be attached to the housing with adhesive or other attachment structures and may directly contact an inner surface of the display cover layer.

DETAILED DESCRIPTION

An electronic device may have a display. The display may be a flexible display such as a light-emitting diode display that is protected by a transparent display cover layer. A flexible light-emitting diode display may have an array of thin-film organic light-emitting diode pixels on a polyimide substrate or other flexible substrate or may have pixels formed from crystalline semiconductor light-emitting diode dies mounted on a flexible substrate.

The flexible display may have a flexible tail. When mounted in an electronic device housing, the tail may be bent back on itself. To help protect the bent tail and other display structures and to assist in mounting the flexible display substrate and display cover layer to an electronic device housing, a molded polymer structure may be formed in a ring running along a peripheral edge of the display. The molded polymer structure, which may sometimes be referred to as a display mounting member, may fully or partly encapsulate the bent tail portion to protect the tail and may form a mounting surface that serves as a datum to help in aligning the display substrate and display cover layer relative to the housing. The display mounting member may serve as a ring-shaped frame or other structural part that helps in securing display structures to the housing. In some configurations, a layer of adhesive may be used to attach the mounting surface of the display mounting member to a mating surface in the housing.

Figure 1:
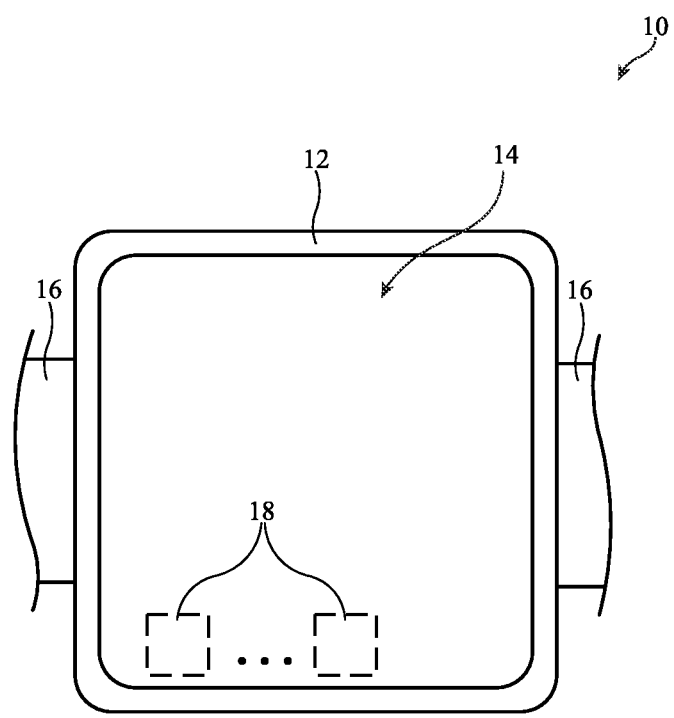
FIG. 1 is a top view of an illustrative electronic device with a display in accordance with an embodiment.

A top view of an illustrative electronic device of the type that may be provided with a molded polymer display mounting member is shown in FIG. 1. Device 10 of FIG. 1 may be a portable device such as a wristwatch having a wristband such as wristband 16, may be a portable device without a wristband such as a cellular telephone or tablet computer, or may be other suitable electronic equipment (e.g., a desktop computer, a voice-control speaker with a display panel, a television or other non-portable display, a head-mounted device, an embedded system such as a system built into a vehicle or home, an electronic device accessory, and/or other electronic device). Illustrative configurations in which device 10 is a wristwatch may sometimes be described herein as an example.

As shown in FIG. 1, device 10 includes a housing such as housing 12. Housing 12 may be formed from polymer, metal, glass, crystalline material such as sapphire, ceramic, fabric, fibers, fiber composite material, natural materials such as wood and cotton, other materials, and/or combinations of such materials. Housing 12 may be configured to form housing walls. The housing walls may enclose one or more interior regions in which internal device components 18 are mounted and may separate the interior region of device 10 from the exterior environment surrounding device 10. In some configurations, an opening may be formed in housing 12 for a data port, a power port, to accommodate audio components, or to accommodate other devices. Clear housing regions may be used to form optical component windows. In the illustrative arrangement of FIG. 1, a transparent housing layer may cover the upper surface of device 10 and may serve as a protective display cover layer for display 14. If desired dielectric housing structures may be used to form radio-transparent areas for antennas and wireless power components.

Electrical components 18 in the interior of device 10 may include integrated circuits, discrete components, light-emitting components, sensors, and/or other circuits and may, if desired, be interconnected using signal paths in one or more printed circuits. Electrical components 18 may include control circuitry. The control circuitry may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in the control circuitry may be used to control the operation of device 10. For example, the processing circuitry may use sensors and other input-output circuitry to gather input and to provide output and/or to transmit signals to external equipment. The processing circuitry may be based on one or more microprocessors, microcontrollers, digital signal processors, baseband processors, power management units, audio chips, application specific integrated circuits, etc. The control circuitry may include wired and/or wireless communications circuitry (e.g., antennas and associated radio-frequency transceiver circuitry such as cellular telephone communications circuitry, wireless local area network communications circuitry, etc.). The communications circuitry of the control circuitry may allow device 10 to communicate with other electronic devices. For example, the control circuitry (e.g., communications circuitry in the control circuitry) may be used to allow wired and/or wireless control commands and other communications to be conveyed between devices such as cellular telephones, tablet computers, laptop computers, desktop computers, head-mounted devices, handheld controllers, wristwatch devices, other wearable devices, keyboards, computer mice, remote controls, speakers, accessory displays, accessory cameras, and/or other electronic devices. Wireless communications circuitry may, for example, wirelessly transmit control signals and other information to external equipment in response to receiving user input or other input from sensors or other devices in components 18.

Input-output circuitry in components 18 of device 10 may be used to allow data to be supplied to device 10 and to allow data to be provided from device 10 to external devices. The input-output circuitry may include input devices that gather user input and other input and may include output devices that supply visual output, audible output, or other output.

Output may be provided using light-emitting diodes (e.g., crystalline semiconductor light-emitting diodes for status indicators and/or displays, organic light-emitting diodes in displays and other components), lasers, and other light-emitting devices, audio output devices (e.g., tone generators and/or speakers), haptic output devices (e.g., vibrators, electromagnetic actuators, piezoelectric actuators, and/or other equipment that supplies a user with haptic output), and other output devices.

The input-output circuitry of device 10 (e.g., the input-output circuitry of components 18) may include sensors. Sensors for device 10 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into a display, a two-dimensional capacitive touch sensor and/or a two-dimensional force sensor overlapping a display, and/or a touch sensor or force sensor that forms a button, trackpad, or other input device not associated with a display), and other sensors. Touch sensors for a display or for other touch components may be based on an array of capacitive touch sensor electrodes, acoustic touch sensor structures, resistive touch components, force-based touch sensor structures, a light-based touch sensor, or other suitable touch sensor arrangements. If desired, a display may have a force sensor for gathering force input (e.g., a two-dimensional force sensor may be used in gathering force input on a display).

If desired, the sensors may include optical sensors such as optical sensors that emit and detect light, optical touch sensors, optical proximity sensors, and/or other touch sensors and/or proximity sensors, monochromatic and color ambient light sensors, image sensors, fingerprint sensors, ultrasonic sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors (e.g., sensors that gather position information, three-dimensional radio-frequency images, and/or other information using radar principals or other radio-frequency sensing), depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, three-dimensional sensors (e.g., time-of-flight image sensors, pairs of two-dimensional image sensors that gather three-dimensional images using binocular vision, three-dimensional structured light sensors that emit an array of infrared light beams or other structured light using arrays of lasers or other light emitters and associated optical components and that capture images of the spots created as the beams illuminate target objects, and/or other three-dimensional image sensors), facial recognition sensors based on three-dimensional image sensors, and/or other sensors.

In some configurations, components 18 may include mechanical devices for gathering input (e.g., buttons, joysticks, scrolling wheels, key pads with movable keys, keyboards with movable keys, and other devices for gathering user input). During operation, device 10 may use sensors and/or other input-output devices in components 18 to gather user input (e.g., buttons may be used to gather button press input, touch and/or force sensors overlapping displays can be used for gathering user touch screen input and/or force input, touch pads and/or force sensors may be used in gathering touch and/or force input, microphones may be used for gathering audio input, etc.). The control circuitry of device 10 can then take action based on this gathered information (e.g., by transmitting the information over a wired or wireless path to external equipment, by supplying a user with output using a haptic output device, visual output device, an audio component, or other input-output device in housing 12, etc.).

If desired, electronic device 10 (e.g., components 18) may include a battery or other energy storage device, connector ports for supporting wired communications with ancillary equipment and for receiving wired power, and other circuitry. In some configurations, device 10 may serve as an accessory and/or may include a wired and/or wireless accessory (e.g., a keyboard, computer mouse, remote control, trackpad, etc.).

Device 10 may include one or more displays such as display 14 (e.g., a display that includes a two-dimensional capacitive touch sensor and/or other touch sensor or a display that is insensitive to touch). The displays may, for example, include an organic light-emitting diode display, a liquid crystal display, a display having an array of pixels formed from respective light-emitting diodes (e.g., a pixel array having pixels with light-emitting diodes formed from respective crystalline light-emitting diode dies such as micro-light-emitting diode dies), and/or other displays. The displays may include rigid display structures and flexible display structures. For example, a light-emitting diode display may have a polymer substrate that is sufficiently flexible to be bent. Display 14 may have a rectangular pixel array or a pixel array of another shape for displaying images for a user and may therefore sometimes be referred to as a pixel array. Display 14 and/or portions of display 14 may also sometimes be referred to as a display panel, display layer, or pixel layer. Each pixel array in device 10 may be mounted under a transparent housing structure (sometimes referred to as a transparent display cover layer, protective cover layer structures, etc.).

Display 14 may have a tail portion. The tail of display 14 (e.g., the tail of a flexible display panel substrate on which the pixel array of display 14 is formed) may be used to carry data signals, clock signals and other control signals, power signals, and/or other display signals from components 18 (e.g., display driver integrated circuits, etc.) to the pixel array. The tail of display 14 may be formed from a protruding elongated strip of flexible polymer (e.g., polyimide) or other display substrate material (e.g., an integral portion of the pixel array substrate). To fit the tail within housing 12, the tail may be bent. For example, the tail of the display may be bent back on itself (e.g., by 180°). This helps ensure that any border structures surrounding display 14 may be relatively narrow.

Figure 2:
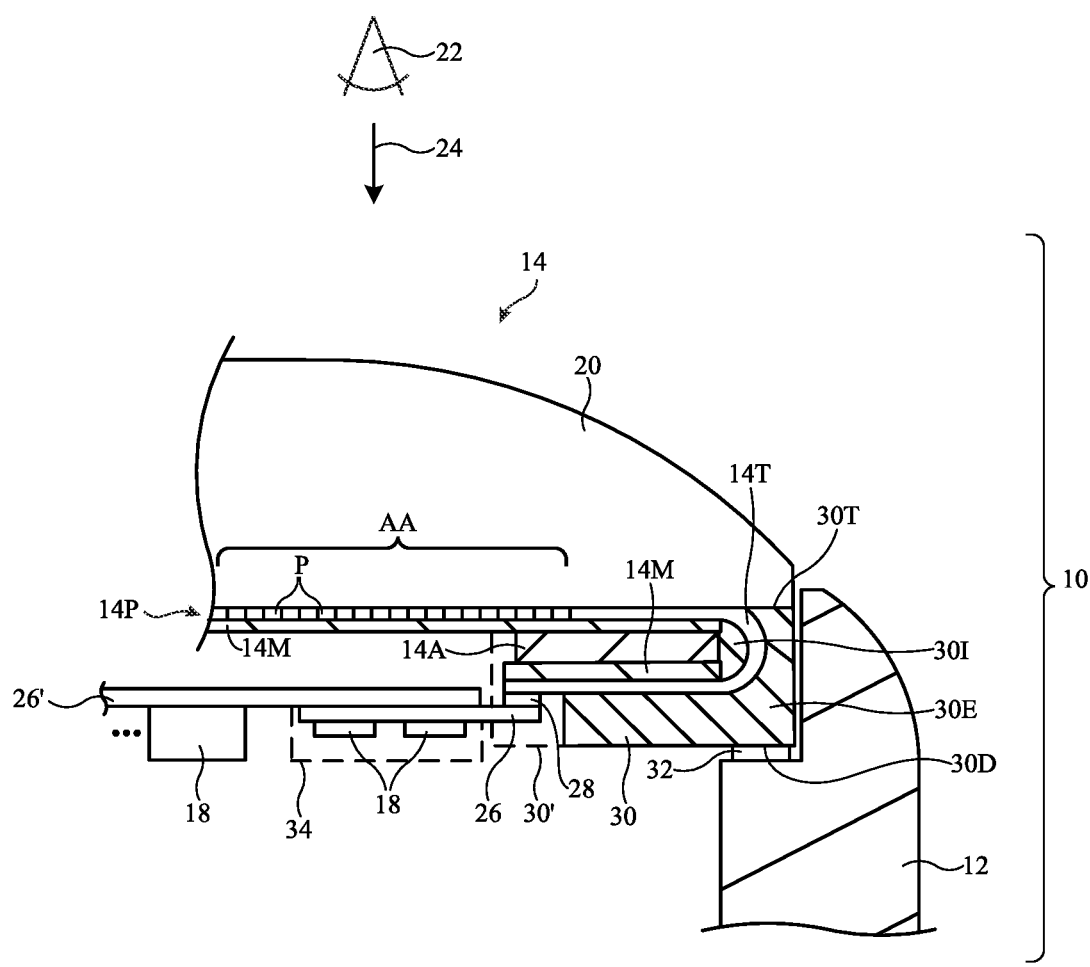
FIG. 2 is a cross-sectional side view of a portion of an illustrative electronic device with a display having a bent tail portion in accordance with an embodiment.

As shown in FIG. 2, display 14 may have a display panel such as display panel 14P with an array of pixels P forming active area AA. During operation of device 10, images may be displayed in active area AA. Display 14 may have an associated protective cover layer such as transparent display cover layer 20. Display cover layer 20 may be formed from one or more layers of glass, clear polymer, crystalline material such as sapphire or other crystalline material, and/or other transparent structures(s). The presence of layer 20 may help protect the outer surface of display panel 14P from scratches.

Display panel 14P may include a protruding tail portion such as tail 14T (e.g., a flexible tail that protrudes from the right edge of a rectangular active area AA towards the right in the example of FIG. 2). When display 14 is mounted in housing 12, tail 14T may be bent back on itself as shown in FIG. 2. This may help minimize the size of any inactive display border that is visible by a user such as viewer 22 who is viewing display 14 in direction 24. An optional strain relief layer (sometimes referred to as a strain neutralization layer or neutral stress plane adjustment layer) may be formed on tail 14T to help minimize stress in conductive traces (signal paths) on tail 14T as tail 14T is bent.

Display 14 may, if desired, include stiffeners such as stiffeners 14M (e.g., polyethylene terephthalate layers), which may be attached to each other by an intervening layer of adhesive such as adhesive 14A (e.g., pressure sensitive adhesive). Components 18 may include display driver integrated circuits and/or other control circuitry for display 14. These components may be mounted directly on tail 14T and/or on one or more additional printed circuits such as printed circuits 26 and 26'. Electrical connections may be made between printed circuit 26', printed circuit 26, and tail 14T using solder, conductive adhesive, welds, connectors, and/or other conductive connections. As an example, printed circuit 26 may be electrically and mechanically attached to tail 14T using a conductive adhesive such as anisotropic conductive film, which forms electrical connections between contacts on printed circuit 26 and mating contacts on tail 14T. Optional shield 34 may cover components 18 on printed circuit 26 (e.g., display driver integrated circuits). Additional printed circuits in device 10 such as illustrative printed circuit 26' may be electrically and/or mechanically attached to printed circuit 26 (e.g., using connectors, anisotropic conductive film connections, solder connections, etc.).

Display mounting member 30 may be formed from molded polymer (e.g., low-injection-pressure-overmolded polymer). The material that forms member 30 may be epoxy, polyurethane, and/or other polymer materials. Thermoplastic and/or thermoset polymer may be used in forming member 30. Heat and/or light (e.g., ultraviolet light) may be used in curing the polymer forming member 30. As one illustrative example, member 30 may be formed from a thermoset structural adhesive such as a one-part heat-cured epoxy. Other polymer(s) may be used, if desired. Vacuum may be applied to the interior of a mold to help draw liquid polymer into a desired shape within the mold during formation of member 30.

Member 30 may include a portion such as interior portion 30I that is interposed between opposing folded-over portions of tail 14T and exterior portion 30E that surrounds some or all of the outwardly facing surfaces of tail 14T. One or more surfaces of member 30 such as lower surface 30D may serve as a reference surface (datum) that helps establish a desired physical relationship between member 30 and other portions of device 10. As an example, surface 30D may be attached to an opposing surface of housing 12 using a layer of adhesive such as adhesive layer 32. The shape and location of surface 30D relative to display cover layer 20, display panel 14P, and other structures in display 14 may help establish a desired position for display 14 relative to housing 12. Surface 30D may be formed by molding and, if desired, subsequent optional machining operations.

In the example of FIG. 2, member 30 partly covers tail 14T. If desired, the size of member 30 may be enlarged (see, e.g., enlarged shape 30') to encapsulate all of tail 14T. The upper surface of member 30 (e.g., upper surface 30T) may be molded directly to the underside of display cover layer 20 to help form an environmental seal.

Figure 3:
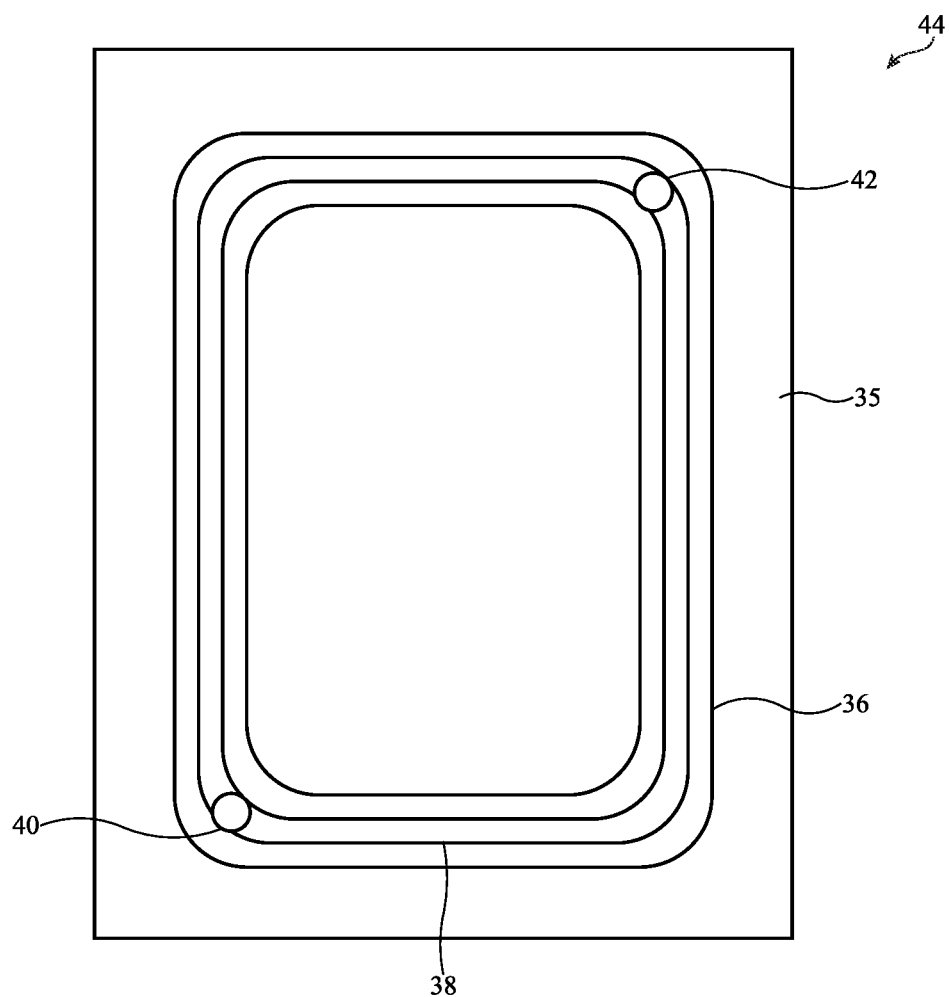
FIG. 3 is a top view of an illustrative mold that may be used in forming a polymer structure that encases part of a display in accordance with an embodiment.

FIG. 3 is a diagram of an illustrative mold that may be used in forming member 30. Mold 44 may include mold base 35. Mold base 35 may be formed from metal or other materials. Mold 44 may have an elastomeric mold ring (e.g., a silicone ring) such as ring 36 that is mounted to base 35. Ring 36 may have a portion that defines a recess such as channel 38 (e.g., a U-shaped channel that faces upwards). During molding operation, ring 36 may be sealed off against the underside of display 14. Uncured liquid polymer may then be dispensed into channel 38 via inlet 40 while vacuum is applied to channel 38 via outlet 42. Following curing of the polymer to form molded member 30, mold 44 may be removed from molded member 30.

Figure 4:
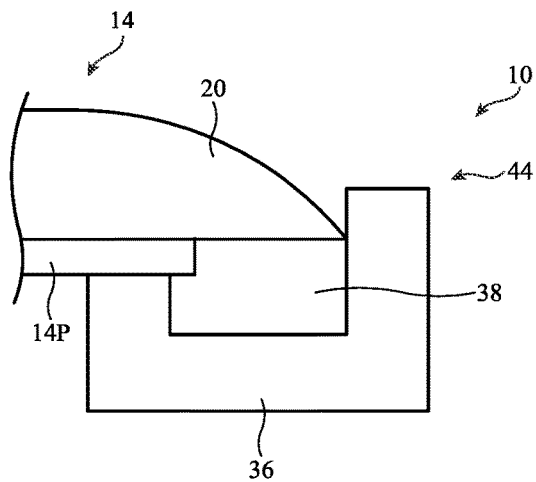
FIGS. 4, 5, and 6 are cross-sectional side views of illustrative display edge portions and associated mold structures in accordance with embodiments.
Figure 5:
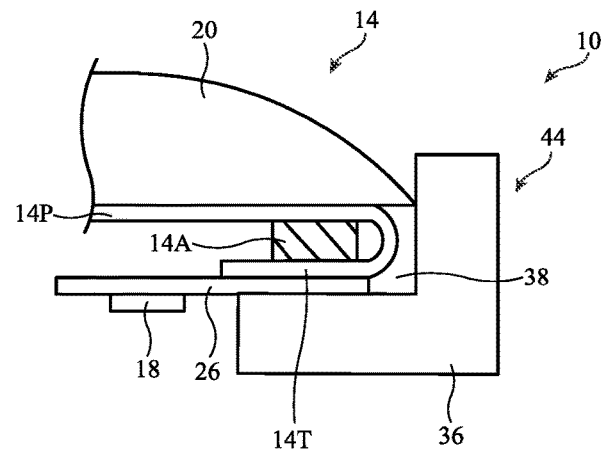
Figure 6:
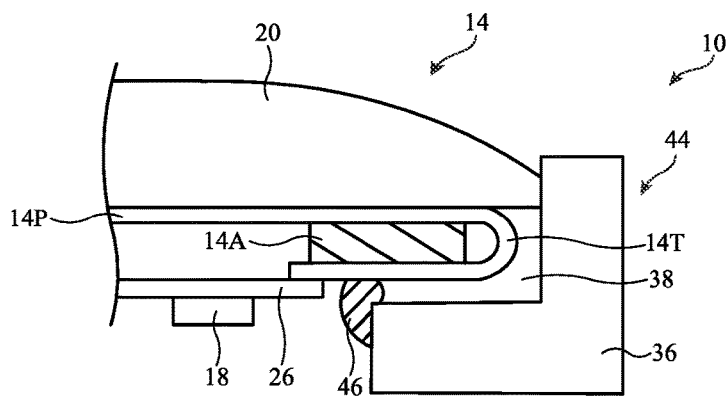

FIGS. 4, 5, and 6 are cross-sectional side views of illustrative display edge portions and associated mold structures.

As shown in FIG. 4, on the edges of display 14 that do not contain tail 14T, elastomeric ring 36 may be pressed upwards against the underside of panel 14P and inwardly (e.g., laterally to the left) on the outer edge of display cover layer 20 to form a seal for channel 38. After forming a sealed channel such as channel 38 by pressing mold 44 against display 14 in this way, polymer may be injected into channel 38 to form member 30.

As shown in FIG. 5, on the edge of display 14 that contains tail 14T, elastomeric ring 36 may press against a structure associated with display 14 such as printed circuit 26 (e.g., a printed circuit coupled to tail 14T). Configurations in which elastomeric ring 36 of mold 44 is pressed directly against tail 14T may also be used, if desired. Pressing against tail 14T directly with elastomeric ring 36 of mold 44 may exert more force on tail 14T than desired. To help reduce applied force, a temporary ultraviolet-light cured polymer structure such as temporary dam 46 may be applied between tail 14T and an opposing portion of ring 36, as shown in FIG. 6. Dam 46, which serves as a temporary portion of mold 44, may, as an example, be formed by applying a bead of liquid ultraviolet-light-cured polymer across some or all of tail 14T followed by ultraviolet light curing. Polymer may then be injected into the cavity of mold 44 (e.g., channel 38) and cured. Following curing of the injected polymer to form member 30, elastomeric ring 36 may be removed and temporary dam 46 may be removed (e.g., dam 46 may be gently peeled away from tail portion 14T before or after removal of ring 36).

Figure 7:
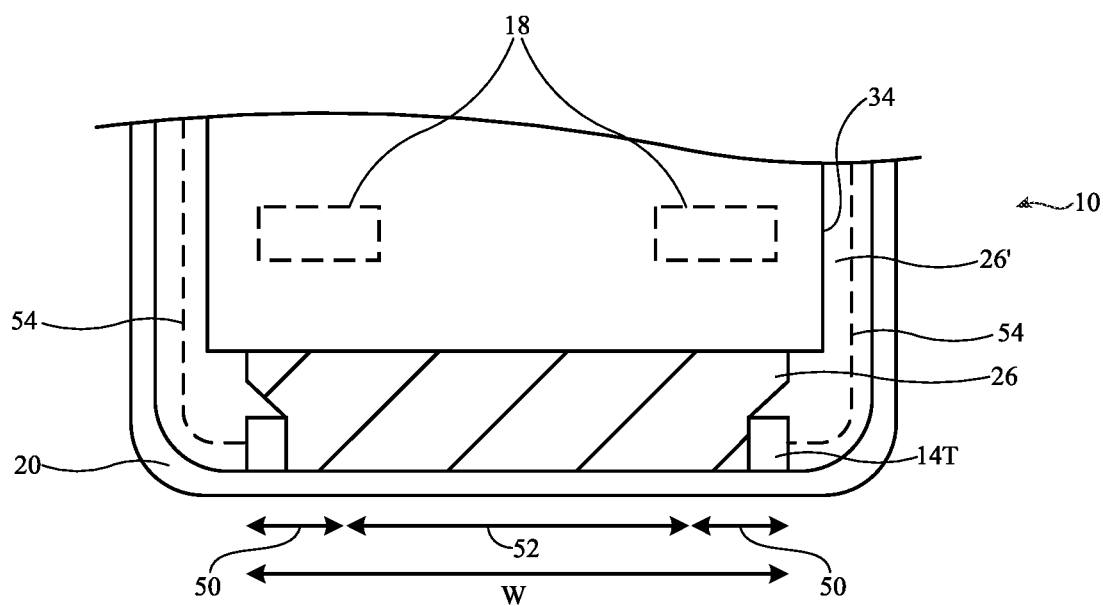
FIG. 7 is a rear view of an interior portion of an illustrative electronic device in accordance with an embodiment.

FIG. 7 is a view of an interior portion of device 10 viewed from the underside of device 10 with rear housing 12 removed. As shown in FIG. 7, tail portion 14T may be bent back on itself near the edge of device 10. Printed circuit 26 may extend from tail portion 14T toward the center of device 10. Optional shield 34, which covers internal components 18 (e.g., display driver integrated circuits on printed circuit 26) may help block electromagnetic interference. Tail portion 14T may be characterized by a width W. Ultraviolet-light-cured polymer for dam 46 (FIG. 6) may extend across the entirety of width W or may be formed across only part of width W (e.g., only in edge portions 50 and not in central portion 52, which may be sealed by direct contact with part of ring 36, or only in central portion 52, and not in edge portions 50, which may be sealed by direct contact with part of ring 36). The use of a peelable adhesive such as dam 46 may help avoid pressure from ring 36 and may help accommodate potential variations in the location (e.g., the height) of tail 14T, variations in display structure locations due to thickness variations in display cover layer 20, and/or variations associated with other display structures. Forming dam 46 only in edge portions 50 may, however, help avoid shrinkage effects in which dam 46 exerts stress on tail portion 14T. Excluding dam 46 from areas with anisotropic conductive film (see, e.g., layer 28 of FIG. 2) may help prevent stress on the film. In arrangements in which member 30 covers tail 14T and adjacent structures, stress (e.g., from a drop event, etc.) may be spread out and therefore dissipated without damaging device 10.

Figure 8:
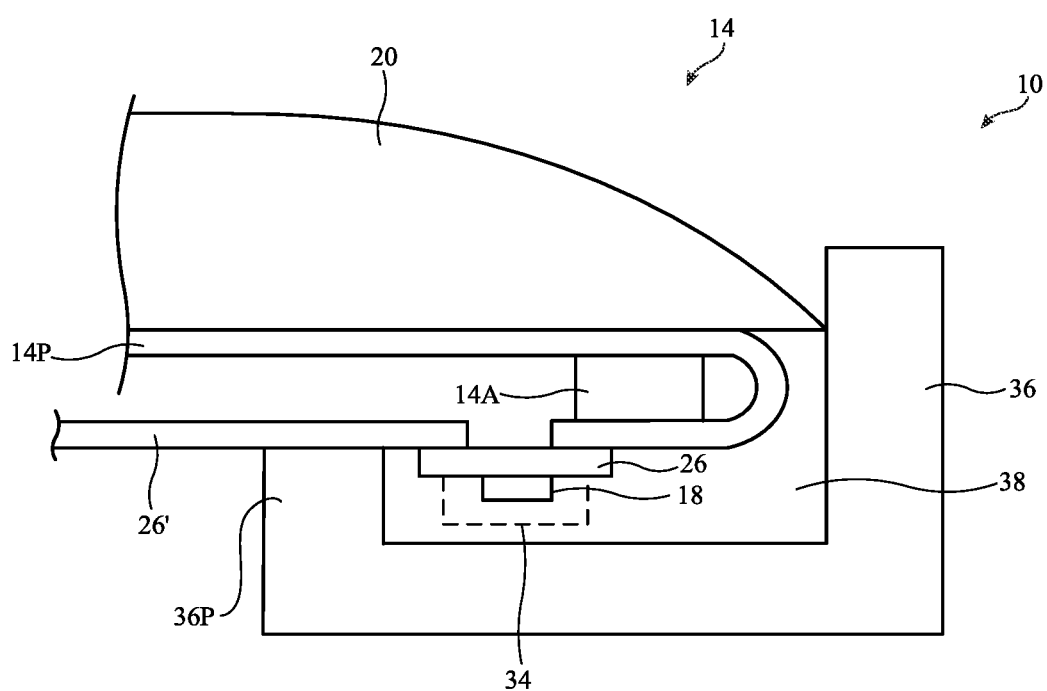
FIGS. 8 and 9 are cross-sectional side views of illustrative display edge portions and associated mold structures in accordance with embodiments.
Figure 9:
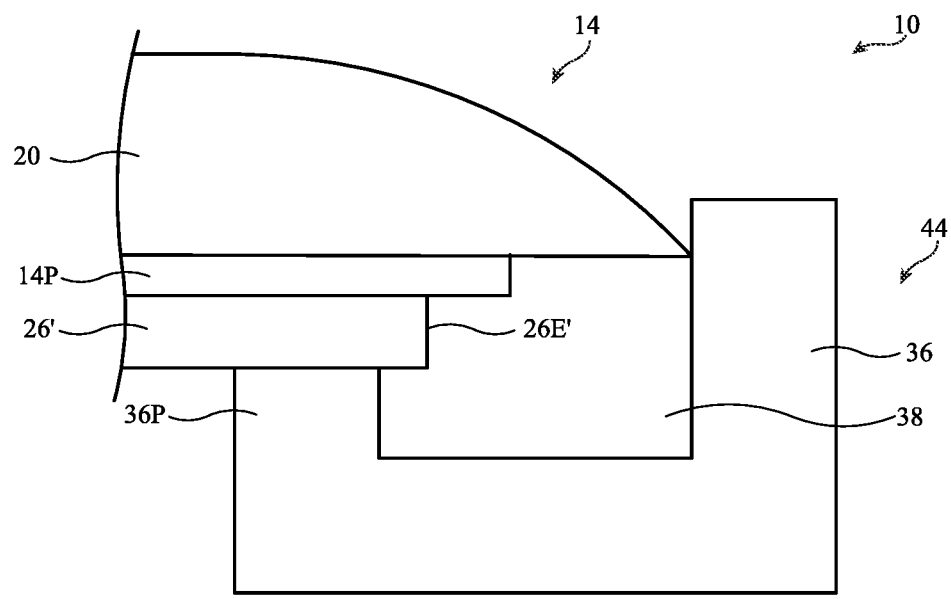

In the example of FIG. 7, the underside of printed circuit 26' is exposed. If desired, mold 44 may be configured to seal off against the exposed underside surface of printed circuit 26' (e.g., along path 54 or other suitable path). FIGS. 8 and 9 are cross-sectional side views of illustrative display edge portions and associated mold structures in configurations in which ring 36 is sealed off against printed circuit 26' in this way. In the example of FIG. 8, portion 36P of ring 36 presses against the surface of printed circuit 26' so as to form a channel (channel 38) that encompasses part of printed circuit 26', printed circuit 26, shield 34, and tail portion 14T. As shown in FIG. 9, along the edges of display 14 that do not include tail portion 14T, portion 36P of ring 36 may press against printed circuit 26' to form a channel (channel 38) that covers edge 26E' of printed circuit 26 and the peripheral edge of panel 14P.

In addition to or instead of sealing off mold 44 on one or more portions of printed circuit 26, printed circuit 26', tail 14T, and/or display cover layer 20, mold 44 may be sealed off on other structures (e.g., on portions of a connector mounted on printed circuit 26, printed circuit 26', or tail 14T, on portions of housing 12, on portions of one or more components 18, and/or on other structures in device 10).

FIGS. 10, 11, 12, 13, 14, 15, and 16 are cross-sectional side views of illustrative displays with molded structures that cover bent display structures to help protect display 14 and other portions of device 10 from damage that might result when excessive stress is applied during an undesired drop event. To help protect display 14, the polymer forming member 30 may, if desired, have different high-strain-rate and low-strain-rate elastic modulus values. During non-drop event times, member 30 may exhibit a relatively low modulus of elasticity to help accommodate movements in the structures of device 10 (e.g., small movements due to expansion and contraction from temperature fluctuations, etc.). When a drop event occurs and stress is rapidly applied to member 30, member 30 may exhibit a higher modulus of elasticity (e.g., member 30 will appear more rigid during a drop event than at other times).

Figure 10:
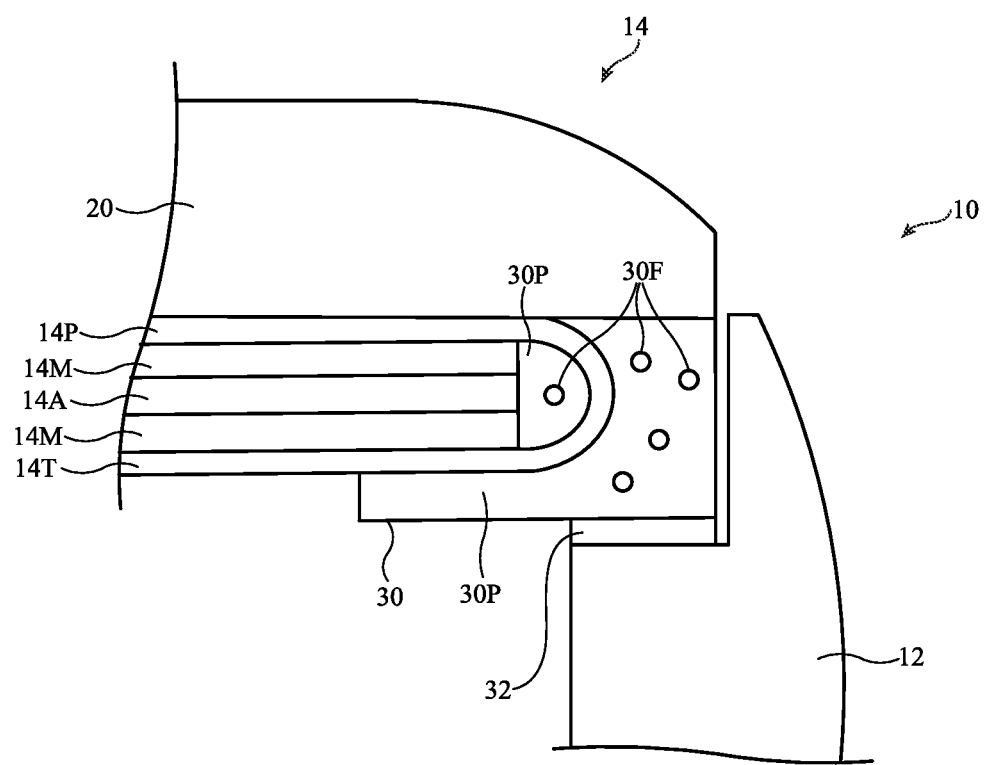
FIGS. 10, 11, 12, 13, 14, 15, and 16 are cross-sectional side views of illustrative displays with molded members that cover bent display structures and other display structures in accordance with embodiments.

In the example of FIG. 10, member 30 has been provided with filler 30F embedded in polymer binder material 30P. Filler 30F may be, for example, a mineral powder such as silica powder or may be formed from particles of other materials. The concentration of filler particles (concentration of filler 30F) that is embedded in member 30 may be sufficiently high to help member 30 resist shrinkage, without making member 30 overly brittle or reducing adhesion.

Figure 11:
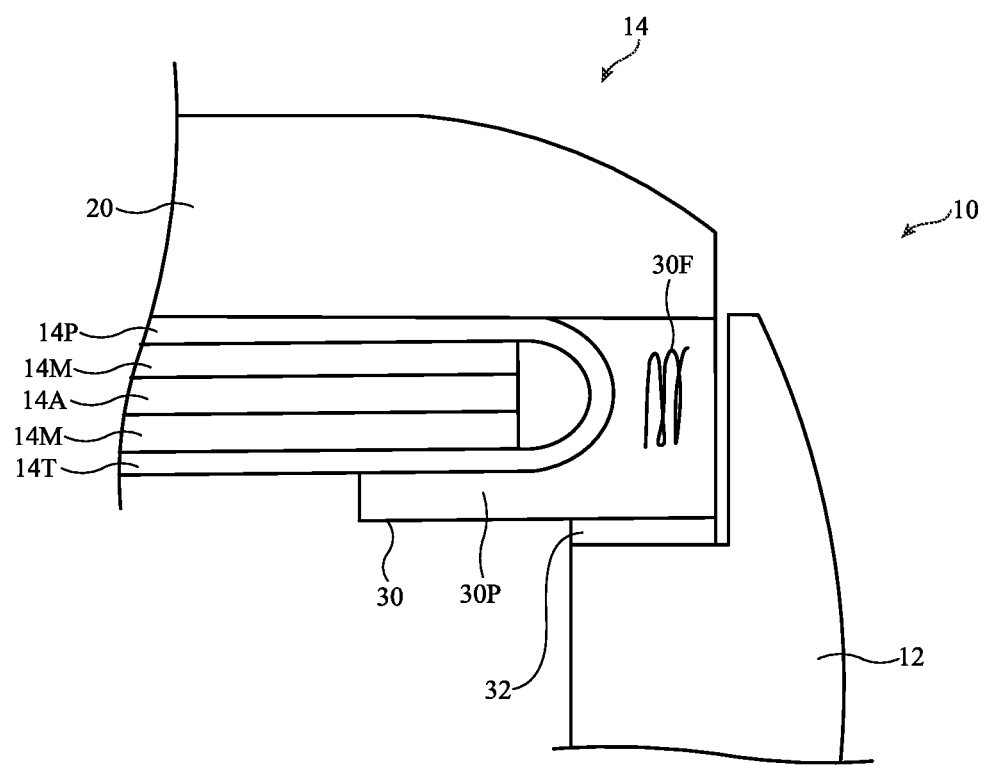

In the example of FIG. 11, filler 30F has been formed from fibers to help strengthen member 30 (e.g., carbon fibers, glass fibers, etc.). The fibers can be oriented to line up with a direction of expected large tensile loads during drop events (e.g., vertically as shown in FIG. 11 or other suitable direction). The fibers can be bulk fibers that are placed in channel 38 prior to introduction of polymer binder material 30P or member 30 may be formed from a liquid polymer that includes pre-dispersed fibers.

Figure 12:
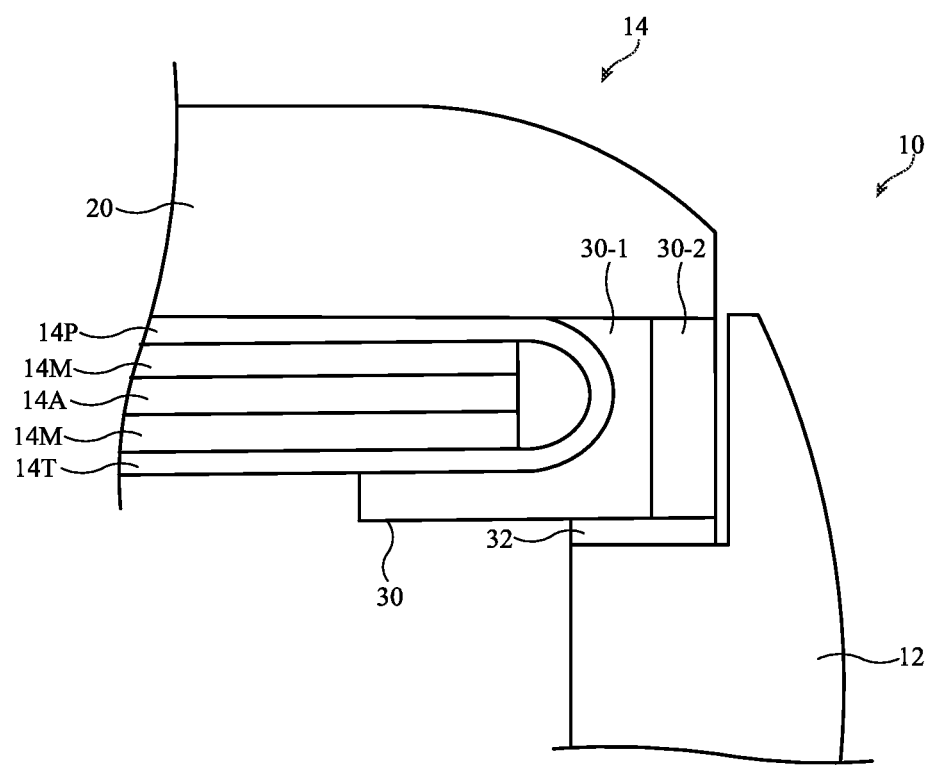

As shown in the illustrative configuration of FIG. 12, member 30 may be formed from multiple pieces that have different mechanical properties. Member 30 may, as an example, have an outer ring portion such as portion 30-2 that surrounds the outer periphery of inner ring portion 30-1. If desired, portion 30-1 may have a lower modulus of elasticity than portion 30-2. With this type of arrangement, portion 30-1 may not impose excessive stress on tail 14T or other portions of display panel 14P, whereas the larger rigidity of portion 30-2 may help portion 30-2 resist damage to member 30 when experiencing excessive force from an undesired drop event. Portions 30-1 and 30-2 may be separate structures that are attached to each other along mating surfaces with an interposed layer of adhesive, may be attached by welding or fasteners, and/or may be formed as respective first and second shots in a two-shot injection molding process.

Figure 13:
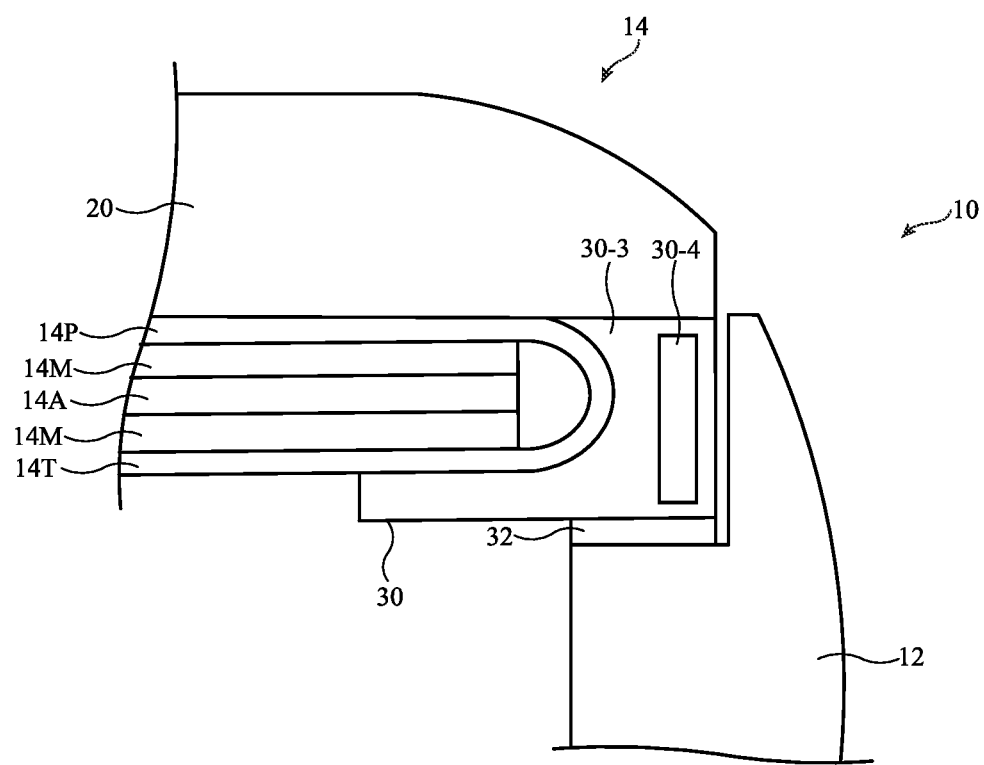

In the illustrative configuration of FIG. 13, one portion of member 30 (e.g., embedded portion 30-4) is embedded within another portion of member 30 (e.g., surrounding portion 30-3). Portions 30-3 and 30-4 may have ring shapes that surround the periphery of display 14 or may have other suitable shapes. Portion 30-3 may have a lower modulus to help lower stress on display 14, whereas portion 30-4 may have a higher modulus to help strengthen the outer portion of member 30 and thereby prevent damage to member 30 and associated portions of device 10 when exposed to excessive stress during an undesired drop event. If desired, portion 30-4 may be formed from metal. Conductive structures such as metal structures associated with portion 30-4 may, if desired, form antenna structures for device 10 (e.g., an inverted-F antenna resonating element or other antenna resonating element for one or more antennas in device 10 that handle wireless communications).

Figure 14:
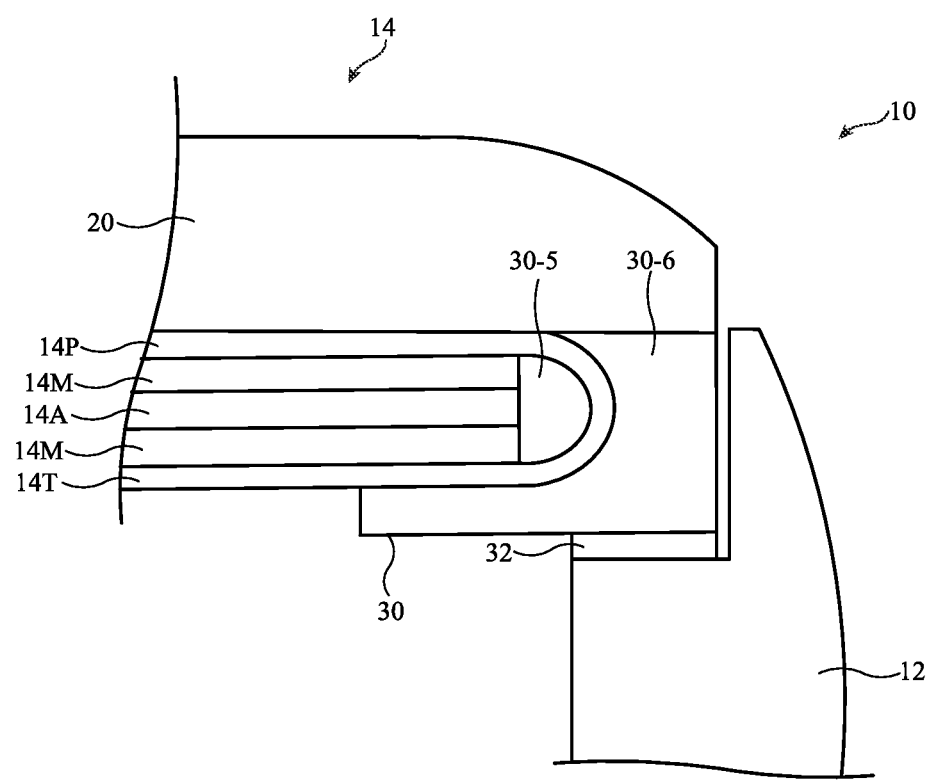

FIG. 14 shows how member 30 may have a first portion such as portion 30-5 that lies within the bent edge of tail 14T and a second portion such as portion 30-6 that faces outwardly around the periphery of member 30. Portions 30-5 and 30-6 may have different compositions and physical properties (e.g., the modulus of portion 30-5 may be higher or lower than that of portion 30-6). Portion 30-5 may, for example, be softer than portion 30-6 to help relieve stress on tail 14T or may be stiffer than portion 30-6 to help rigidly support tail 14T (e.g., to prevent tail 14T from bending excessively during an undesired drop event, which could stress metal traces associated with the signal paths on tail 14T).

If desired, one or more of the portions of member 30 may be optically transparent (e.g., to serve as a ring-shaped waveguide or other light guiding structure to convey light from a light-emitting diode around the periphery of device 10).

Figure 15:
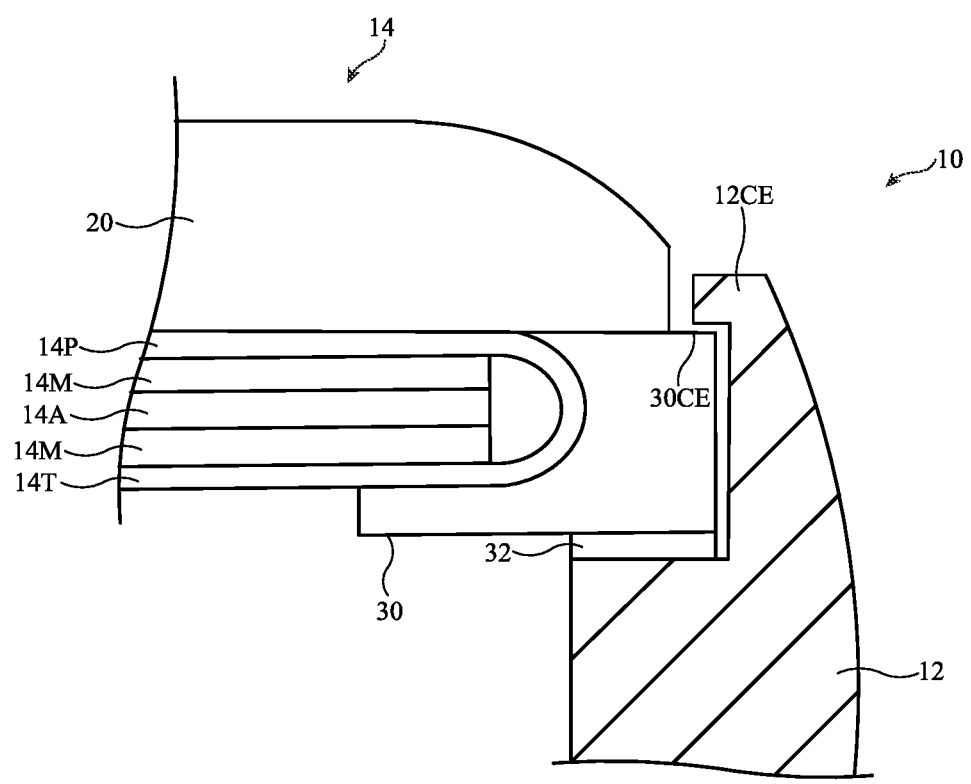

FIG. 15 is a cross-sectional side view of device 10 in an illustrative configuration in which outer peripheral edge portion 30CE of member 30 protrudes outwardly (laterally, to the right in FIG. 14) past the laterally outermost peripheral edge of display cover layer 20 and is captured under inwardly protruding ledge portion 12CE of housing 12. Portion 12CE and adjacent portions of housing 12 form a recess in housing 12 that receives the outer edge of member 30 and thereby helps to retain member 30 within housing 12. Adhesive such as adhesive 32 and/or other attachment structures (screws or other fasteners, interlocking engagements structures, welds, etc.) may be used in attaching housing 12 to member 30 or may be omitted.

Figure 16:
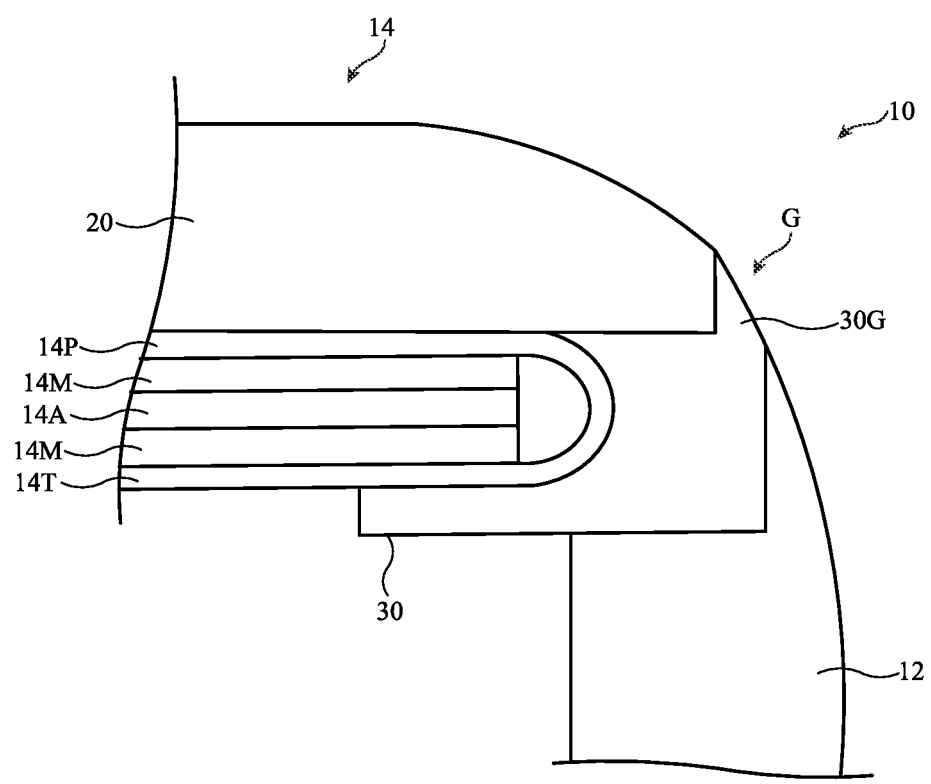

If desired, one or more of the surfaces of housing 12 may form a mold surface during molding of member 30. This type of arrangement is shown in FIG. 16. In the example of FIG. 16, member 30 includes portion 30G which fills gap G between housing 12 and display cover layer 20. The outer surface of portion 30G in gap G is exposed to the exterior environment surrounding device 10 and may lie flush with the exterior surfaces of display cover layer 20 and housing 12. The inwardly and upwardly facing surfaces of housing 12 (e.g., a housing sidewall) cooperate with the surfaces of ring 36 to serve as mold surfaces for the ring-shaped channel used in forming member 30. Because member 30 is formed by molding polymer in place against housing 12, adhesive need not be used in attaching member 30 to housing 12. The polymer for forming member 30 may be injected from the inside or outside of housing 12. If desired, interlocking engagement structures (e.g., inwardly facing bulbous protrusions on housing 12) may be used to help hold housing 12 to member 30.

Figure 17:
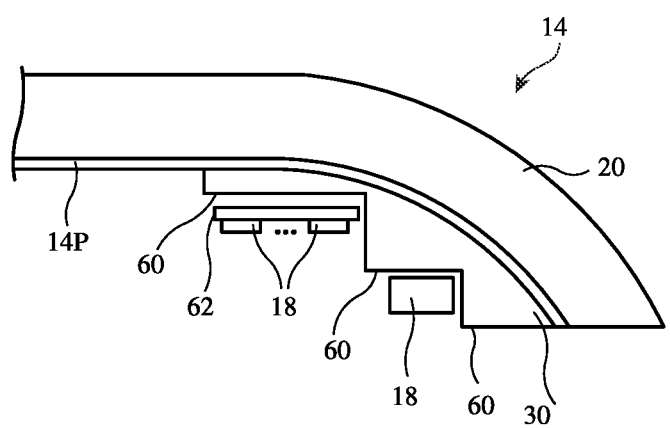
FIG. 17 is a cross-sectional side view of an illustrative curved display with a molded staircase-shaped planarization layer in accordance with an embodiment.

If desired, molded polymer may be used to facilitate mounting of housing structures and electrical component in device 10. For example, polymer may be molded on internal device surfaces such as inwardly facing housing wall surfaces, portions of display panel 14, portions of display cover layer 20, etc. Consider, as an example, display 14 of FIG. 17. In the example of FIG. 17, display panel 14P has one or more peripheral edges with curved cross-sectional profiles. The edges of display panel 14P on the left and right edges of device 10 may, as an example, be bent downward out of the plane of the main portion of display panel 14P. This may help minimize the visibility of inactive display borders in device 10.

Due to the bent edge portions of display panel 14P of FIG. 17, the inwardly facing surface (e.g., the lower surface) of display panel 14P has exposed curved surfaces. In the example of FIG. 17, the curved inner surface areas of display panel 14P are located near the periphery of display 14. In general, any suitable portion of display panel 14P may have a curved cross-sectional profile.

It can be challenging to mount printed circuits and other components on a curved surface such as the inner surface of the bent portions of display panel 14P. Accordingly, molded polymer may be used to form member 30 on the curved inner surface of display panel 14P. Member 30 may be molded against display panel 14P or may be shaped separately (e.g., in a mold) and attached to display panel 14P with a layer of adhesive (as examples).

As shown in FIG. 17, member 30 may have a curved outer surface with a curved cross-sectional profile that matches the curved cross-sectional profile of display panel 14P (which, in turn, has a shape that matches the curved inner surface of display cover layer 20). The shape of member 30 may be configured to form one or more planar surfaces or other surfaces that serve as mounting surfaces for internal components and/or that otherwise facilitate assembly of housing structures and circuitry into the interior of device 10.

For example, member 30 may serve as a planarization structure that transforms the curved inner surface of display panel 14P into one or more planar surfaces (e.g., planar vertical surfaces, planar horizontal surfaces, etc.). In the arrangement of FIG. 17, member 30 serves as a planarization layer for display panel 14P and has a staircase shape (e.g., member 30 forms a staircase-shaped planarization layer with steps having horizontally extending planar step surfaces 60 and corresponding vertically extending planar surfaces between successive step surfaces 60). There may be any suitable number of planar step surfaces such as surfaces 60 on member 30 (e.g., a single surface 60, two surfaces 60, three or more surfaces 60, etc.). Configurations in which a staircase shape is used for member 30 may help ensure that excessive interior volume in device 10 is not consumed by member 30 (e.g., the internal device volume consumed by member 30 can be maintained relatively small by forming steps in member 30 that follow the curved contour of display panel 14P). Other planarization structures may be formed from members such as member 30 on the inner surface of display panel 14P, if desired.

A planarization structure for display 14 may be formed as a single ring-shaped member that extends around the periphery of display 14 under bent edge portions of the periphery of panel 14P, may be formed from multiple separate polymer members (e.g., a first strip-shaped polymer member that runs along the left edges of display 14 and a second strip-shaped polymer member that runs along the right edge of display 14), and/or may have other configurations with one or more separate sections.

As shown in FIG. 17, planar surfaces 60 may serve as supporting surfaces for components in the interior of device 10 such as printed circuit 62 and illustrative components 18. Components 18 may include integrated circuits, sensors, control circuitry, discrete components, haptic devices, light-emitting devices, batteries, and/or other electrical components. Components such as components 18, printed circuits, brackets and other support structures, and/or other structures may be attached to surfaces 60 by fasteners (e.g., screws and other threaded fasteners, etc.), by adhesive, and/or using other attachment structures. As an example, printed circuit 62 may be attached to one of surfaces 60 by a layer of adhesive, components 18 may be attached to one of surfaces 60 (with or without printed circuit 62) using fasteners that are received within threaded openings in surfaces 60, and/or other attachment mechanisms, etc.

If desired, molded polymer may be used in forming optically clear structures (e.g., lens members) through which images from displays or other light associated with the operation of components in device 10 passes. Consider, as examples, the arrangements of FIGS. 18 and 19. In these examples, polymer has been molded into a shape that allows member 30 to serve as a lens member interposed between display panel 14P and display cover layer 30. The polymer may be molded onto the inner surface of layer 20 and/or the outer surface of display panel 14P directly, or one or more of the surfaces of member 30 may be molded into a desired shape in a mold and subsequently attached to the inner surface of layer 20 and/or the outer surface of display panel 14P using adhesive.

Figure 18:
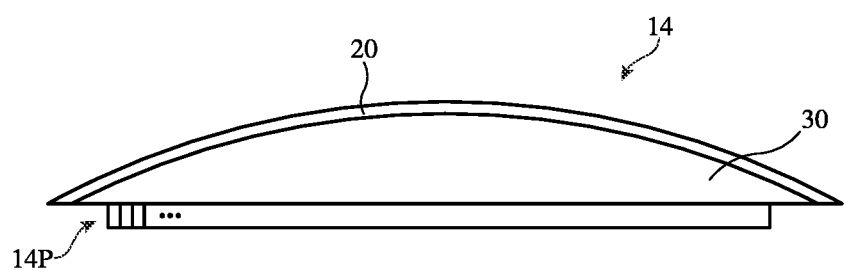
FIGS. 18 and 19 are cross-sectional side views of displays overlapped by clear molded polymer members and display cover layers in accordance with embodiments.
Figure 19:
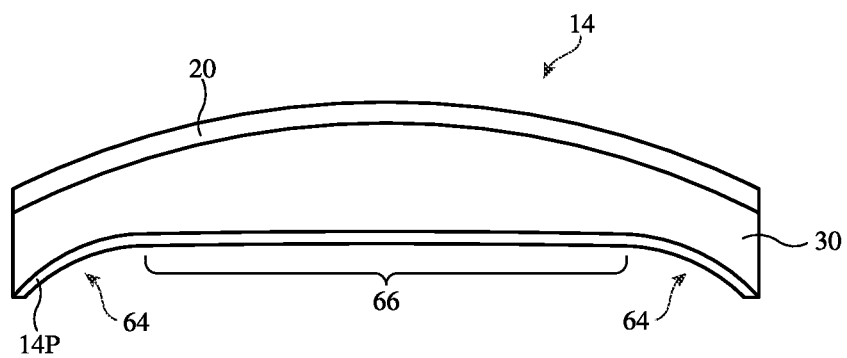

Polymer member 30 of FIGS. 18 and 19 may be formed from an optically clear polymer. Display cover layer 20 may be formed from polymer, crystalline material such as sapphire, ceramic, glass, other materials, and/or combinations of these materials. In an illustrative configuration, display cover layer 20 of FIGS. 18 and 19 is formed from a rigid material such as glass. Other materials may be used for display cover layer 20, if desired.

The surfaces of display cover layer 20 may include curved surfaces of compound curvature (sometimes referred to as surfaces with Gaussian curvature) or curved surfaces with non-Gaussian curvature (sometimes referred to as developable surfaces). If desired, one or more portions of the surfaces of display cover layer 20 may be planar. In the example of FIG. 18, display cover layer 20 has inner and outer surfaces with curved cross-sectional profiles. Member 30 has an outer surface that has the same shape as the mating inner surface of display cover layer 20. The outer surface of member 30 and the opposing inner surface of display cover layer 20 in this example both have curved cross-sectional profiles (e.g., surface shapes with compound curvature or non-Gaussian curvature).

The lower (inwardly facing) surface of polymer member 30 in the FIG. 18 example is planar. In this type of example, display panel 14P may be mostly or entirely planar in one or both of its dimensions (e.g., from top-to-bottom and/or left-to-right). For example, display panel 14P may have a planar outwardly facing surface that is attached to the opposing planar inwardly facing surface of member 30 by a layer of adhesive. Adhesive may also be used in attaching the outer surface of member 30 to display cover layer 20.

The clear polymer material used for forming polymer member 30 of FIG. 18 and the surface shapes (e.g., the planar inner surface and curved outer surface) of polymer member 30 of FIG. 18 allow polymer member 30 to serve as a lens that bends the rays of light emitted from the pixels of display 14P. The shape of member 30 (e.g., the thickness of member 30 and the curvature of the outer surface of member 30) can be configured to spread the image produced by display panel 14P laterally and/or to otherwise adjust the appearance of the image displayed on display panel 14P. The presence of member 30 may also help provide structural strength and/or to help a planar display structure (e.g., a planar array of pixels) interface with a dome-shaped display cover layer or a display cover layer with another curved output surface. If desired, the images displayed on display panel 14P of FIG. 18 may be digitally predistorted to compensate for any optical distortion imposed on the images by the lens formed from polymer member 30.

In the example of FIG. 18, the active area of display panel 14P (e.g., the portion of display panel 14P with pixels that display images) is planar (and optionally the inactive area of display panel 14P that does not contain pixels is planar). In the example of FIG. 19, display panel 14P has curved edges. These curved edges may include curved edge portions of the active area of display panel 14P (and, if desired, curved edge portions of the inactive area of display panel 14P). As shown in FIG. 19 for example, display panel 14P may have curved cross-sectional profiles associated with bent left and right edges (curved regions 64). In central region 66, display panel 14P may have planar inner and outer surfaces or some or all of display panel 14 in region 66 may have curved inner and outer surfaces.

Polymer member 30 of FIG. 19 may be formed from a clear polymer that allows member 30 to serve as a lens element covering display panel 14P. The portions of member 30 that overlap curved edge regions 64 of display panel 14P may have curved inner surfaces that match the corresponding curved outer surfaces of display panel 14P. In central region 66, the inner surface of member 30 may be planar or may be curved. The thickness of member 30 may be larger over curved regions 64 than over central region 66 (as an example) to help accommodate the downward curvature of panel 14P in regions 64.

The outer surface of member 30 of FIG. 19 has a curvature that matches the curvature of the mating inner surface of display cover layer 20. Cover layer 20 may be planar, may be planar with bent edges, may have a dome shape, may have other shapes with compound curvature (e.g., a planer shape with a peripheral edge of compound curvature, a planar shape with edges of non-Gaussian curvature and corners of compound curvature, etc.). Because the inner and outer surfaces of member 30 may have different shapes, the inner surface of member 30 may be shaped to accommodate downwardly bend edges of display panel 14P in regions 64, whereas the outer surface of member 30 may be configured to match with the surface profile of display cover layer 20. This allows display cover layer 20 to have a desired shape (e.g., a shallow curved shape or other curved shape that is different than the curved shape of panel 14P in regions 64).

The thickness of member 30 may be at least 0.5 mm, at least 1 mm, at least 2 mm, at least 4 mm, less than 1 cm, less than 5 mm, or other suitable thickness. The thickness of display cover layer 20 may be at least 0.2 mm, at least 0.5 mm, at least 1 mm, less than 3 mm, less than 2 mm, etc. Display panel 14P may be a bendable display such as a flexible organic light-emitting diode display or a display having an array of light-emitting diodes with crystalline semiconductor dies mounted on a flexible display panel substrate.

Arrangements of the type shown in FIGS. 17, 18, and 19 may have display panels 14P with bent edges and, if desired, bent display panel edges embedded in polymer members, as described in connection with FIGS. 2-16 and/or may have display panels without bent edges.

Figure 20:
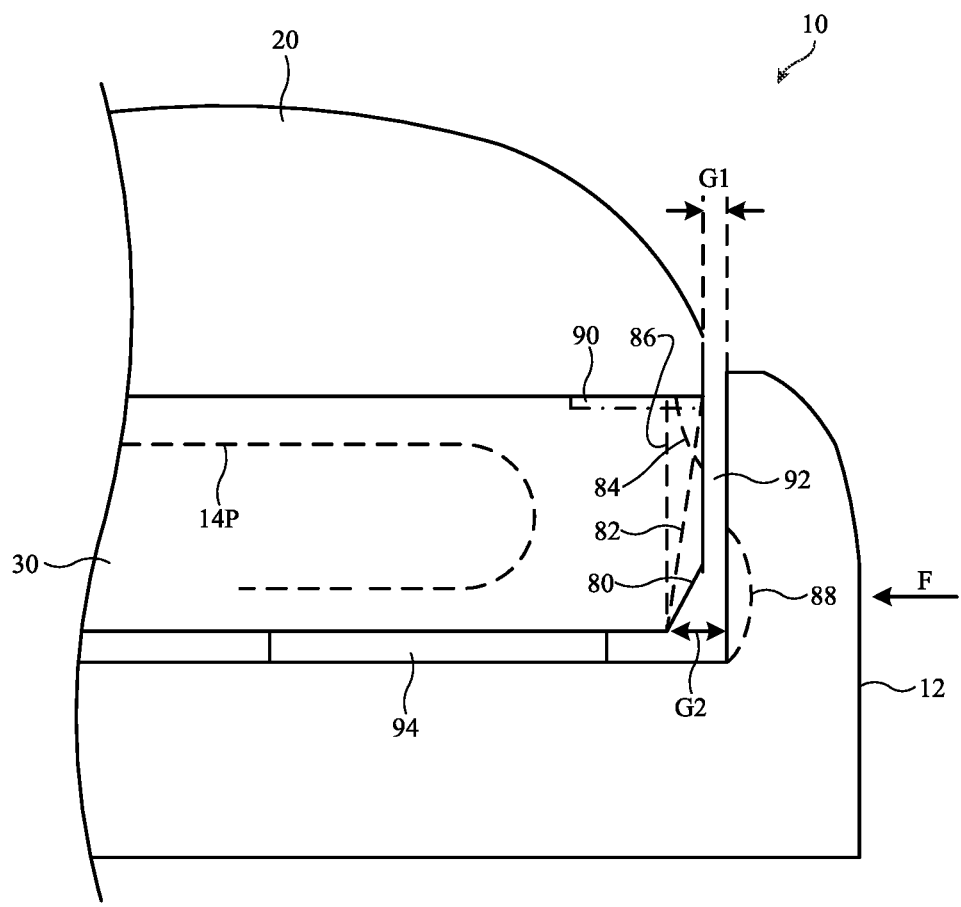
FIG. 20 is a cross-sectional side view of a portion of an illustrative electronic device with a display in accordance with an embodiment.

Device 10 may sometimes be subjected to unexpected drop events or other situations where excessive force is applied to housing 12. Consider, as an example, device 10 of FIG. 20. As shown in FIG. 20, device 10 may be dropped on one of its edges, which may give rise to an excessive force F against housing 12. This excessive force may cause housing 12 to deform inwardly and may therefore cause the inner surface of housing 12 to move towards the opposing edge surface of member 30.

The molded polymer of member 30 may contain embedded structures such as display panel 14P and/or other circuitry. Member 30 may be molded to the underside of layer 20 (e.g., in a ring running along the periphery of layer 20). In some embodiments, a ring-shaped layer of opaque material (e.g., a layer of ink) may be formed around the periphery of the active area AA of display 14 to help hide display driver circuitry and other structure along the border of the display from view. This layer of opaque material may be formed between the underside of the peripheral portion of layer 20 and opposing portions of panel 14P. A layer of adhesive such as pressure sensitive adhesive layer 94 may be used to attach housing 12 to member 30.

Because the inner surface of housing 12 deforms inwardly in response to an excessive force F on housing 12, there is a risk that the inner surface of housing 12 may contact member 30. Member 30 and/or housing 12 can therefore be configured to prevent excessive force from being transferred between housing 12 and member 30, even in situations in which housing 12 is deformed inwardly during a drop event. By limiting or eliminating contact between housing 12 and member 30, damage to member 30 can be prevented in the event that device 10 is dropped or otherwise subjected to excessive force. For example, cracks in member 30 can be prevented and potential damage to adjacent structures can also be prevented (e.g., crack formation in the ring-shaped ink layer between member 30 and layer 20 can be prevented, etc.).

In an illustrative configuration, member 30 is configured so that the edge of member 30 that is facing housing 12 is separated from the opposing inner surface of housing 12 by a gap such as gap 92. Gap 92 may be an air-filled gap or may be filled with a viscous fluid (e.g., oil) or a soft elastomeric material (e.g., silicone or thermoplastic polyurethane). Gap 92 may be relatively small near the interface between member 30 and layer 20. For example, housing 12 and member 30 may be separated by a gap of width G1 at the upper surface of member 30, where the value of G1 is 50 microns, at least 25 microns, less than 100 microns, etc.

If housing 12 were to contact member 30 near the opposing lower surface of member 30, a lever arm configuration would be created that could potentially exacerbate the impact of housing 12 on member 30 (resulting in possible delamination or cracking). To help prevent contact between housing 12 and the edge surface of member 30 at the lower surface of member 30 (where the edge surface of member 30 meets the lower surface), gap 92 may be selectively enlarged near the lower surface of member 30, thereby creating an uneven width for gap 92. Gap 92 may, for example be enlarged to exhibit a width G2 that is greater than G1. The value of G2 may be, for example, 150 microns, at least 75 microns, less than 300 microns, or other suitable size.

As shown in FIG. 20, one illustrative arrangement for forming enlarged gap width G2 involves forming a recess in the edge surface using a chamfer along the lower peripheral edge of member 30 (see, e.g., recessed surface 80). In addition to forming this recess in member 30 and/or instead of forming a recess in member 30, housing 12 may be provided with a corresponding recessed portion such as illustrative recess 88. The presence of a recess such as recess 88 creates an uneven width for gap 92. Gap 92 may also have other configurations, if desired. As an example, member 30 may have a slanted edge surface such as angled surface 82 that creates an angled recess in the edge surface of member 30 and therefore a gap width for gap 92 that progressively widens with increasing distance away from the inner surface of layer 20 (e.g., a gap with a tapered shape), may have a top chamfer (see, e.g., recess 84), and/or may be recessed along the entire surface of the edge of member 30 (see, e.g., illustrative recess 86 of FIG. 20). Different shapes and/or sizes may be used for the recesses in the edge surface of member 30 (and/or the recesses in the opposing housing surface) at different portions along the periphery of device 10. As an example, in the vicinity of the bent tail of display panel 14P, member 30 may have a chamfer forming recessed surface 80. This shape may help prevent contact between the housing and member 30 during a drop event while avoiding excessive removal of material from the edge of member 30 laterally adjacent to panel 14P. In portions of device 10 located away from the tail of display panel 14P, the recess in member 30 may have a shape such as the tapered shape of recessed surface 82. Transitions between different recess profiles and/or between different portions of recess profiles (e.g., different straight portions of a recess profile) may be smoothed by providing these areas with non-zero radii of curvature, thereby further helping to prevent stress and crack formation.

The coefficient of thermal expansion of the molded polymer material used for member 30 and the glass or other material used for layer 20 may differ. To help prevent shear stress between the top surface of member 30 and the opposing inner surface of layer 20 to which member 30 is attached (e.g., during temperature fluctuations), a peripheral ring-shaped layer such as ring-shaped layer 90 may be interposed between member 30 and layer 20. Ring-shaped layer 90 may be formed from a softer material than the molded polymer of member 30. For example, layer 90 may be formed from a polymer with a lower elastic modulus than the material of member 30 (e.g., layer 90 may be an elastomeric polymer ring). As a result, when member 30 shifts laterally with respect to layer 20 (e.g., due to a change in temperature), layer 90 will stretch to accommodate relative movement between the upper surface of member 30 and the opposing lower surface of layer 20. In addition to or instead of forming layer 90 from a material that stretches to accommodate lateral shifts of layer 20 and member 30 relative to each other, layer 90 may be formed from a material (e.g., polymer) that breaks free of member 30 and/or layer 20 under excessive stress (e.g., layer 90 may serve as a sacrificial layer that helps hold member 30 to layer 20 until exposed to an excessive amount of force).

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
   a display configured to produce an image, wherein the display has a display layer with a bent tail;
   a housing surrounding an interior region; and
   a molded polymer member having a surface attached to the housing, wherein at least a portion of the bent tail is embedded in the molded polymer member, and the molded polymer member comprises a ring-shaped member running along a peripheral edge of the display.

2. The electronic device defined in claim 1 wherein the molded polymer member has a first ring-shaped portion with a first modulus of elasticity and has a second ring-shaped portion with a second modulus of elasticity that is different than the first modulus of elasticity.

3. The electronic device defined in claim 1 further comprising a metal member embedded in the molded polymer member.

4. The electronic device defined in claim 1 wherein the molded polymer member comprises polymer binder and filler embedded in the polymer binder.

5. The electronic device defined in claim 1 wherein the display layer comprises a flexible polymer substrate with an array of pixels, wherein the bent tail is formed from a portion of the flexible polymer substrate, and wherein the display has a display cover layer that overlaps the array of pixels.

6. The electronic device defined in claim 5 wherein the housing separates the interior region from an exterior region surrounding the housing, wherein the housing is separated from the display cover layer by a gap, and wherein a portion of the molded polymer member that is exposed to the exterior region fills the gap.

7. The electronic device defined in claim 1 wherein the display comprises a display cover layer having an inwardly facing surface and wherein the molded polymer member has a first surface that contacts the inwardly facing surface and an opposing second surface that is attached to the housing.

8. The electronic device defined in claim 7 further comprising a layer of adhesive configured to attach the second surface to the housing.

9. The electronic device defined in claim 1 wherein the molded polymer member has a first portion between respective portions of the bent tail and comprises a second portion that contacts an outwardly facing surface of the bent tail.

10. The electronic device defined in claim 9 wherein the first and second portions have first and second different elastic modulus values.

11. The electronic device defined in claim 1 wherein the housing has a ledge portion configured to form at least part of a housing recess.

12. The electronic device defined in claim 11 wherein the molded polymer member has a protruding portion that is received within the housing recess and wherein the ledge portion is configured to retain the molded polymer member against the housing.

13. The electronic device defined in claim 1 further comprising:
   a printed circuit; and
   a display driver integrated circuit on the printed circuit, wherein a portion of the molded polymer member contacts the printed circuit.

14. The electronic device defined in claim 13 wherein the bent tail is electrically coupled to the printed circuit.

15. The electronic device defined in claim 1 further comprising a wrist band coupled to the housing.

16. An electronic device, comprising:
   a housing having a surface;
   a display panel having an array of pixels on a flexible substrate with a tail that is bent back on itself;
   a display cover layer that overlaps the display panel; and
   a ring-shaped molded polymer member in which at least a portion of the tail is embedded, wherein the ring-shaped molded polymer member runs around a peripheral edge of the array of pixels and has a surface that is attached to the surface of the housing.

17. The electronic device defined in claim 16 further comprising a layer of adhesive that is configured to attach the surface of the ring-shaped molded polymer member to the surface of the housing.

18. The electronic device defined in claim 16 wherein the ring-shaped molded polymer member has a portion that protrudes laterally past an outwardly facing peripheral edge of the display cover layer.

* * * * *

UNITED STATES PATENT AND TRADEMARK OFFICE
CERTIFICATE OF CORRECTION

| | |
|---|---|
| PATENT NO. | : 12,079,036 B2 |
| APPLICATION NO. | : 17/340893 |
| DATED | : September 3, 2024 |
| INVENTOR(S) | : Daniel J. Barrett et al. |

Page 1 of 1

It is certified that error appears in the above-identified patent and that said Letters Patent is hereby corrected as shown below:

On the Title Page

Left Column, Item (60) "Related U.S. Application Data", is missing and should read -- Provisional application No. 63/109,128, filed on Nov. 3, 2020, provisional application No. 63/044,306, filed on Jun. 25, 2020. --

Signed and Sealed this
Twentieth Day of May, 2025

Coke Morgan Stewart
*Acting Director of the United States Patent and Trademark Office*